United States Patent [19]

Izumi et al.

[11] Patent Number: 5,314,175

[45] Date of Patent: May 24, 1994

[54] WIRE CLAMPING DEVICE AND WIRE CLAMPING METHOD

[75] Inventors: Yasuo Izumi, Ikoma; Nobuya Matsumura, Kyoto; Akihiro Yamamoto; Yutaka Makino, both of Kobe, all of Japan

[73] Assignee: Matsushita Electric Industrial Co., Ltd., Kadoma, Japan

[21] Appl. No.: 869,193

[22] Filed: Apr. 13, 1992

Related U.S. Application Data

[63] Continuation of Ser. No. 494,217, Feb. 27, 1990, abandoned.

[51] Int. Cl.$^5$ .............................................. B25B 1/06
[52] U.S. Cl. .................................. 269/224; 269/254 R; 310/328
[58] Field of Search .................. 269/224, 249, 254 R; 310/328

[56] References Cited

U.S. PATENT DOCUMENTS

| | | | |
|---|---|---|---|
| 906,385 | 12/1908 | Christians | 269/224 |
| 3,150,870 | 9/1964 | Nelson | 269/224 |
| 3,855,633 | 8/1989 | Shibuya | 310/328 |
| 4,570,095 | 2/1986 | Uchikawa | 310/328 |
| 4,675,568 | 6/1987 | Uchikawa et al. | 310/328 |
| 4,714,855 | 12/1987 | Fujimoto | 310/328 |
| 4,854,424 | 8/1989 | Yamatoh et al. | 310/328 |

Primary Examiner—Bruce M. Kisliuk
Assistant Examiner—Eileen Morgan
Attorney, Agent, or Firm—Ratner & Prestia

[57] ABSTRACT

A wire clamping device which is used to clamp bonding wire in the wire bonding of electronic components comprising: a fixed arm; a movable arm that is positioned so that the end of the fixed arm faces the and of the movable arm with a suitable gap, the movable arm being capable of bending so that the end of the movable arm approaches the end of the fixed arm; and a piezoelectric element that is attached to the movable arm which bends the movable arm by mechanical deformation of the piezoelectric device in order to clamp wire between the end of the movable arm and the end of the fixed arm. A wire clamping method for clamping bonding wire comprising bending a movable arm toward a fixed arm during wire bonding of electronic components by means of mechanical deformation of a piezoelectric element, the deformation being generated by applying a voltage to the piezoelectric element.

4 Claims, 6 Drawing Sheets

WIRE CLAMPING DEVICE AND WIRE CLAMPING METHOD

This application is a continuation of application Ser. No. 07/494,217, filed Feb. 27, 1990, abandoned.

BACKGROUND OF THE INVENTION

1. Field of the Invention

The present invention relates to a wire clamping device and wire clamping method used to clamp bonding wires in the wire bonding of electronic components.

2. Description of the Prior Art

Figure 4:
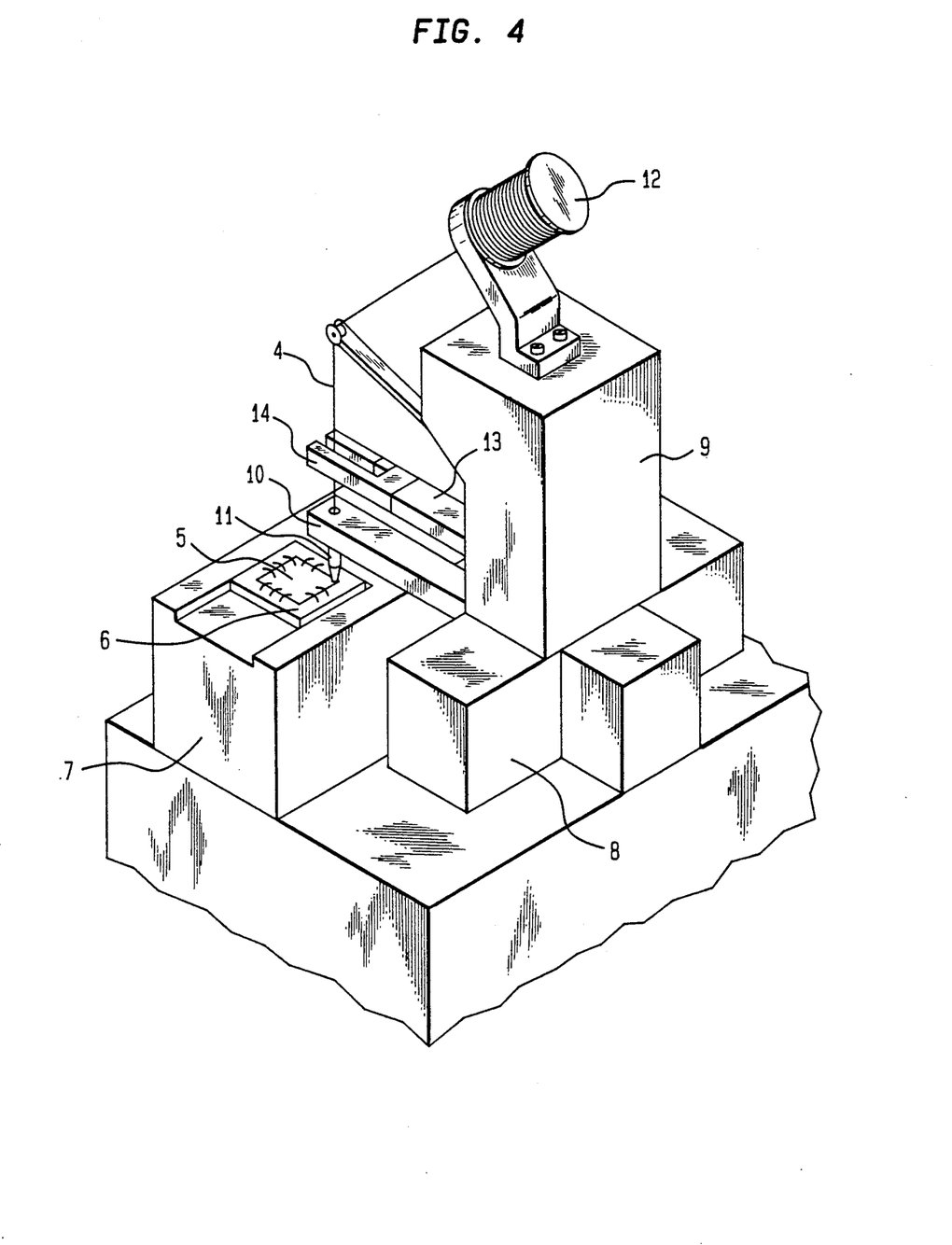
FIG. 4 is a perspective view of a wiring bonding apparatus which uses the wire clamping device.

In semiconductor devices and other electronic components, gold, aluminum and other types of bonding wire are generally used to bond the pad (electrode) of the pellet and the substrate. An example of a wiring bonding apparatus used in wire bonding is shown in FIG. 4. This wiring bonding apparatus is used to bond a substrate 6 and a pellet 5 of a semiconductor device. Said wire bonding apparatus has a positioning table 7 on which the substrate 6 is placed and a bonding head 9 which is moved in the X and Y directions (horizontally) with respect to said positioning table 7. Said bonding head 9 is moved horizontally by the X-Y drive section 8. The bonding head 9 supports the bonding arm 10 in a horizontal state so it can move up and down. The end of said bonding arm 10 is positioned above the substrate 6 placed on the positioning table 7, and a bonding tool 11 is attached to the end of the bonding arm 10. Above the bonding arm 10, a wire clamping device 14 is supported by the end of the clamping device support arm 13 which is in a horizontal state. Said wire clamping device support arm 13 is attached to the bonding head 9 and can move up and down. The wire clamping device 14 clamps the vertical wire 4 unwound off the wire spool 12 above the bonding head 9.

Wire bonding is performed by this wire bonding device as described below. After the substrate 6 is placed on the positioning table 7 and positioned, the X-Y drive section 8 drives the bonding head 9 in the X-Y directions. This causes the bonding tool 11 to move above the pellet 5 on top of the substrate 6 so the end of the bonding tool 11 and said pellet 5 oppose each other. While in this state, the bonding arm 10 comes down. This causes the bonding tool 11 to press the wire 4 against the pad of the pellet 5, and the wire 4 is bonded to the pad of the pellet 5. The bonding arm 10 rises after the wire 4 is bonded to the pad of the pellet 5.

The bonding head 9 is then moved in the X-Y direction by the X-Y drive section 8, and the bonding tool 11 moves above the substrate 6. This moves the end of the bonding tool 11 so it opposes the post of the substrate 6 where there is no pellet 5. The movement of the bonding tool 11 at this time unwinds wire from the wire spool 12. In this state, the bonding arm 10 comes down and the wire 4 is pressed against and bound to the post of the substrate 6 by the bonding tool 11.

When the pad of the pellet 5 and the post of the substrate 6 are connected by the wire 4 in this manner, the wire clamping device 14 operates and clamps the perpendicular wire 4. The clamping device support arm 13 then rises and the wire clamped by the clamping device 14 is cut away from the post of the substrate 6 to which it was bonded by the bonding tool 11.

The wire used in wire bonding generally ranges from several microns to several tens of microns in diameter.

Figure 5:
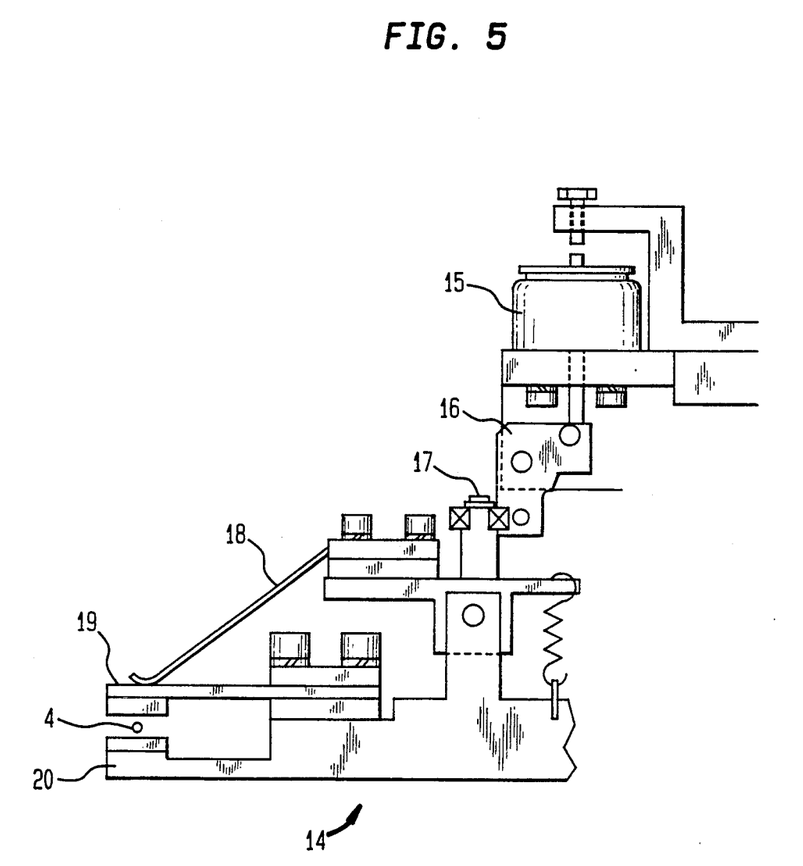
FIG. 5 is a plan view of a wire clamping device of the prior art.

The wire clamping device 14 used on this kind of wire bonding apparatus generally has the structure shown in FIG. 5. Said wire clamping device 14 has a pair of parallel arms 19 and 20. The end of each arm 19 and 20 oppose each other, and the perpendicular wire 4 passes between them. The arm 20 is fixed and the end of the other arm 19 is in contact with the end of the plate spring 18, and said plate spring 18 causes the end of the arm 19 to move near the end of the fixed arm 20. When the end of the movable arm 19 is moved toward the end of the fixed arm 20 by the plate spring 18, the perpendicular wire 4 positioned between the ends of the two arms 19 and 20 is clamped by the ends of the two arms 19 and 20.

The base of the plate spring 18 is linked to the lever 16, which is capable of rotating, through the rotating member 17, which is also capable of rotating. Said lever 16 is linked to the solenoid 15, and the lever 16 is rotated by driving the solenoid 15. The rotation of the lever 16 causes the rotating member 17 to rotate, which in turn causes the end of the plate spring 18 to move the end of the movable arm 19 toward the end of the fixed arm 20.

In the wire clamping device 14 with this configuration, the movable arm 19 is moved and clamps the wire 4 by activating the solenoid 15, and clamping is released by deactivating the solenoid 15. Therefore, the clamping force on the wire 4 remains fixed and cannot be changed. As a result, if a wire 4 with a different diameter is to be clamped, the wire 4 cannot be clamped with a suitable clamping force. Further, there are many parts and the structure is complicated, so assembly, adjustment and maintenance are difficult and response is poor.

SUMMARY OF THE INVENTION

The wire clamping device which is used to clamp bonding wire in the wire bonding of electronic components of this invention, which overcomes the above-discussed and numerous other disadvantages and deficiencies of the prior art, comprises a fixed arm; a movable arm that is positioned so that the end of said fixed arm faces the end of said movable arm with a suitable gap, said movable arm being capable of bending so that said end of said movable arm approaches said end of said fixed arm; and a piezoelectric element that is attached to said movable arm which bends said movable arm by mechanical deformation of said piezoelectric device in order to clamp wire between said end of said movable arm and said end of said fixed arm.

In a preferred embodiment, the movable arm functions as a plate spring.

In a preferred embodiment, the wire clamping surface of said fixed arm end is flat, and the clamping surface of the movable arm end is flat and becomes nearly parallel to the clamping surface of said fixed arm end when the movable arm is bent to clamp a wire.

The wire clamping method for clamping bonding wire comprises bending a movable arm toward a fixed arm during wire bonding of electronic components by means of mechanical deformation of a piezoelectric element, said deformation being generated by applying a voltage to said piezoelectric element.

In a preferred embodiment, the amount of bend of said movable arm varies according to the amount of mechanical deformation of said piezoelectric element and the amount of mechanical deformation generated in said piezoelectric element varies according to the voltage applied to said piezoelectric element.

In a preferred embodiment, the voltage to be applied to said piezoelectric element is sought beforehand based on the amount of deformation of said piezoelectric element that is required to obtain the clamping force necessary to clamp a wire of a prescribed diameter and the voltage to be applied to said piezoelectric element during wire clamping is set from said voltages obtained beforehand based on the diameter of said wire to be clamped.

As a result, the wire clamping device of the present invention has excellent response and a clamping force suitable to the diameter of the wire being clamped can be obtained extremely easily. Further, there are few parts and the structure is simple, so maintenance is easy.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
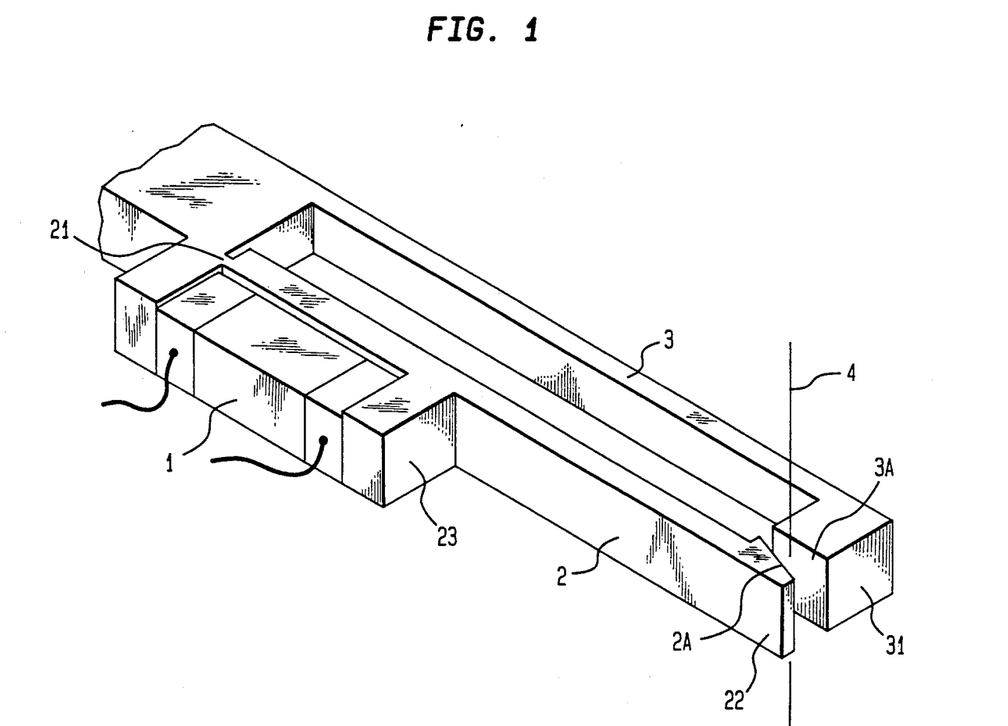
FIG. 1 is a perspective view of an example of the wire clamping device of the present invention.

The wire clamping device of the present invention, as shown in FIG. 1, has a pair of arms 2 and 3 which clamp the wire 4. The arms 2 and 3 are parallel to each other, and the ends of the two arms oppose each other with an appropriate space between them. The one arm 3 is fixed. The other arm 2 is supported by the point of support 21 so it bends like a plate spring toward the fixed arm 3, and by bending the movable arm 2, its end 22 comes near the end 31 of the fixed arm 3. The perpendicular wire 4 passes between the ends 22 and 31 of the two arms 2 and 3. The opposing surfaces of the ends 22 and 31 of the two arms 2 and 3 comprise flat clamping surfaces 2a and 3a. When the end 22 of the movable arm 2 comes near the end 31 of the fixed arm 3, the wire 4 positioned between the two ends 22 and 31 is clamped by the opposing flat clamping surfaces 2a and 3a.

A piezoelectric element 1 is positioned near the point of support 21 of the movable arm 2. When a voltage is applied to said piezoelectric element 1, a mechanical deformation occurs in said piezoelectric element 1. The movable arm 2 is equipped with an interaction member 23 which receives the force of the deformation of said piezoelectric element 1, and the piezoelectric element 1 pushes against said interaction member 23 by, means of the generated mechanical deformation so said movable arm 2 bends at the point of support 21. When the movable arm 2 is bent by the deformation of the piezoelectric element 1, the end 22 of said movable arm 2 comes near the end 31 of the fixed arm 3.

The part between the interaction member 23 of the movable arm 2 and the point of support 21 of the movable arm 2 is thicker than the other part. Therefore, when the wire 4 is clamped by the ends 22 and 31 of the arms 2 and 3, the reaction force of the wire 4 causes the part toward the end of the movable arm 2 to bend more than the interaction member 23.

The flat clamping surface 2a at the end 22 of the movable arm 2 is inclined with respect to the flat clamping surface 3a of the fixed arm 3 when the movable arm 2 is not bent. The inclined state of the clamping surface 2a of the movable arm 2 with respect to the clamping surface 3a of the fixed arm 3 becomes parallel with the clamping surface 3a of said fixed arm 3 when the movable arm 2 bends and its clamping surface 2a and the clamping surface 3a of the fixed arm 3 clamp the wire 4.

A wire clamping device with this configuration is used in place of the clamping device 14 of the wire bonding apparatus shown in FIG. 4. The operating principle of said clamping device is explained below.

Figure 2A:
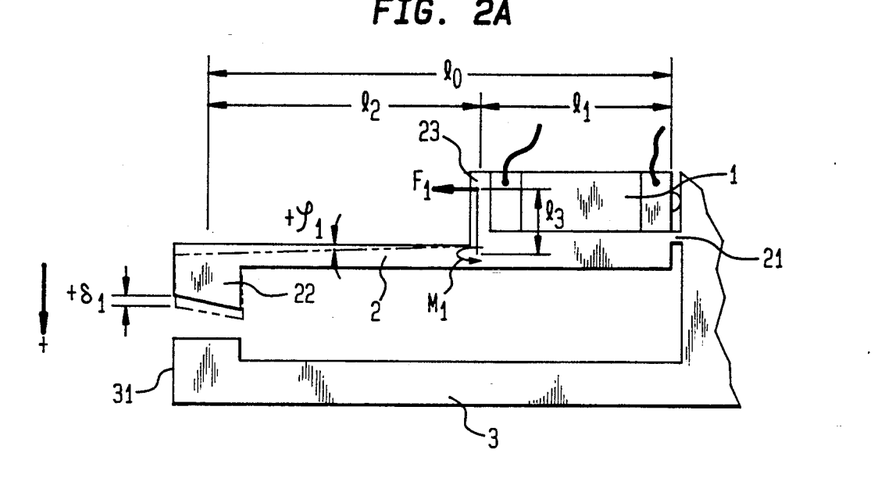
FIGS. 2a-2d are figures describing operation.

As shown in FIG. 2a, where, the distance from the point of support 21 of the movable arm 2 to the point where the wire 4 is clamped is $l_0$ and the distance from the point of support 21 to the center axis of the interaction member 23 which receives the bending force of the piezoelectric element 1 is $l_1$, so that $l_0 - l_1 = l_2$; the force applied to the interaction member 23 by the deformation of the piezoelectric element 1 is $F_1$; the distance from the point on the interaction member 23 position which receives force $F_1$ and the top surface of the thinner end part of the movable arm 2 is $l_3$; the banding moment generated in the interaction member 23 by the force $F_1$ applied by the piezoelectric element 1 is $M_1$; the angle of bend of the movable arm generated by the bending moment $M_1$ is $\mathcal{J}_1$; and the amount of displacement in the clamping surface 2a of the movable arm 2 in this case is $\delta_1$; the following equations are obtained based on Castigliano's theorem.

$$M_1 = F_1 \cdot l_3 \tag{1}$$

$$\mathcal{J}_1 = \frac{\partial}{\partial M_1}\left(\frac{1}{2}\int_0^{l_1} \frac{M_1^2}{E \cdot I_{z1}} dx\right) = \int_0^{l_1} \frac{M_1}{E \cdot I_{z1}} dx \tag{2}$$

$$\delta_1 = \frac{\partial}{\partial F_1}\left(\frac{1}{2}\int_0^{l_1} \frac{M_1^2}{E \cdot I_{z1}} dx\right) \cdot \frac{l_0}{l_1} \tag{3}$$

where, E is Young's modulus and $I_{z1}$ is the geometrical moment of inertia.

Figure 2B:
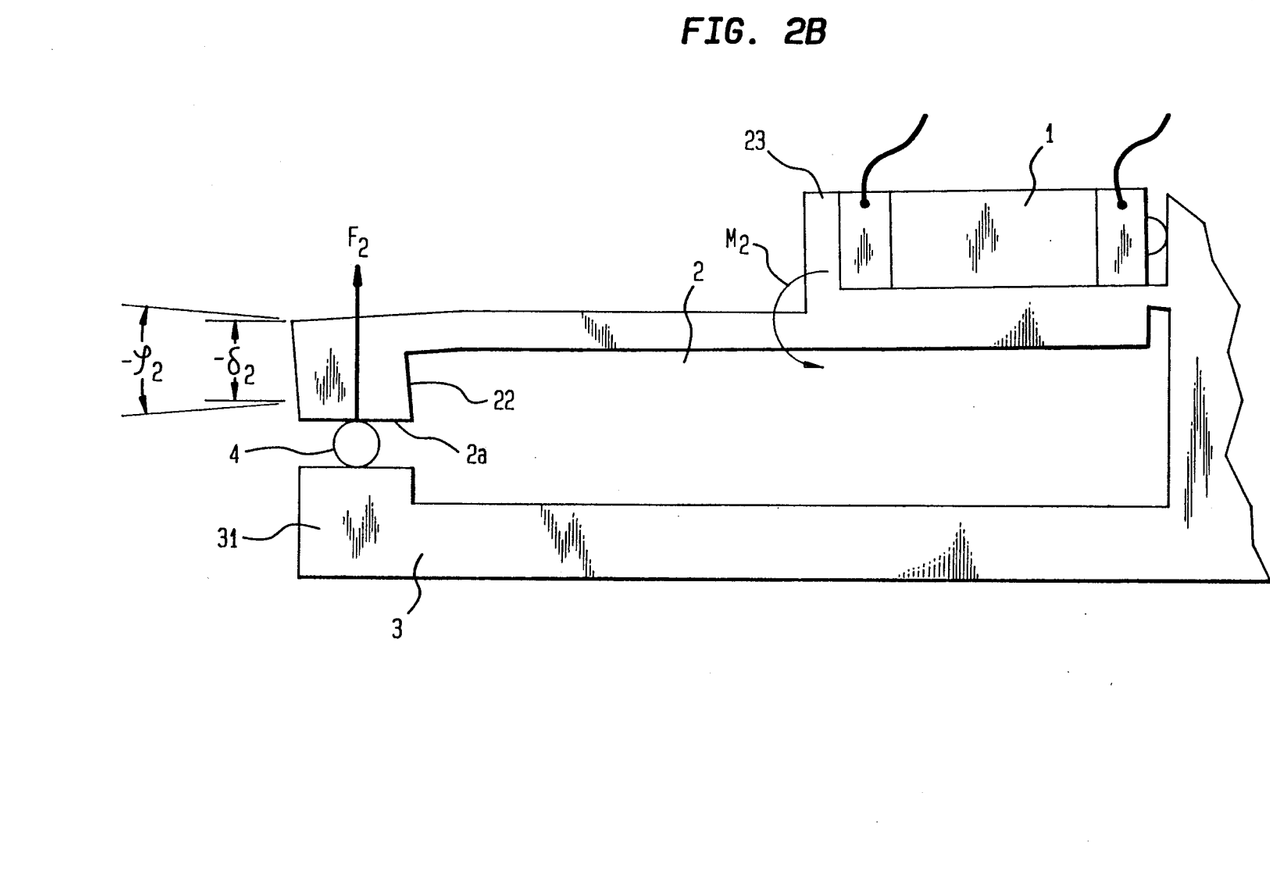

FIG. 2b shows the state wherein the movable arm 2 is bent and the wire 4 is clamped. In this case, where, the force applied to the clamping surface 2a of the movable arm 2 by the wire 4 is $F_2$; the bending moment generated in the interaction member 23 by this force $F_2$ is $M_2$ (the direction of arrow in FIG. 2b is positive); the banding angle of the movable arm 2 is $\mathcal{J}_2$; and the amount of bending displacement is $\delta_2$; the following equations are established.

$$M_2 = F_2 \cdot l_2 = F_2(l_0 - l_1) \tag{4}$$

$$\mathcal{J}_2 = \frac{\partial}{\partial M_2}\left(\frac{1}{2}\int_{l_1}^{l_0} \frac{M_2^2}{E \cdot I_{z2}} dx\right) = \int_{l_1}^{l_0} \frac{M_2}{E \cdot I_{z2}} dx \tag{5}$$

$$\delta_2 = \frac{\partial}{\partial F_2}\left(\frac{1}{2}\int_{l_1}^{l_0} \frac{M_2^2}{E \cdot I_{z2}} dx\right) \tag{6}$$

where, E is Young's modulus and $I_{z2}$ is the geometrical moment of inertia.

Figure 2C:
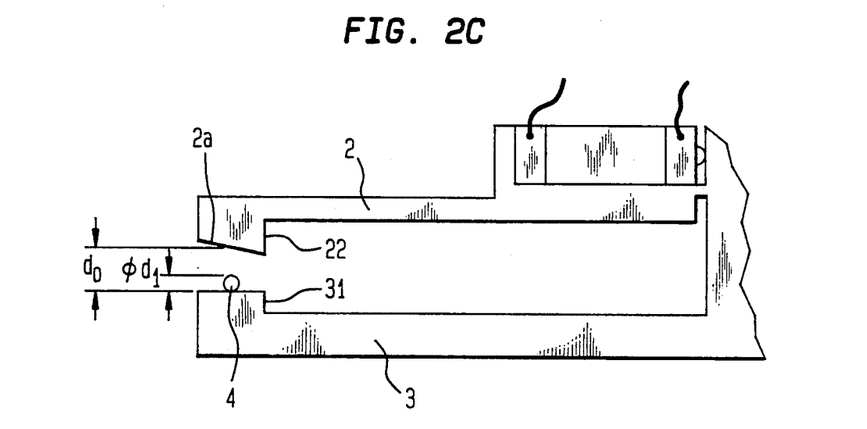

As shown in FIG. 2c, where the initial gap at the point the wire 4 is clamped by the clamping surfaces 2a and 3a of the movable arm 2 and the fixed arm 3 is $d_0$ and the diameter of the wire 4 is $d_1$, the following equations are obtained.

$$d_0 - d_1 = \delta_1 - \delta_2 \quad (7)$$

$$\mathcal{Y}_1 - \mathcal{Y}_2 = \int_0^{l_1} \frac{M_1}{E \cdot I_{z1}} dx - \int_{l_1}^{l_0} \frac{M_2}{E \cdot I_{z2}} dx \quad (8)$$

In order to obtain the force $F_2$ necessary to clamp a wire 4 of diameter $d_1$ based on the above equations, we seek the force $F_1$ applied by the piezoelectric element 1 to the movable arm 2 and calculate the deformation of the piezoelectric element 1 required to generate this force $F_1$. We also seek the voltage necessary to obtain this deformation based on the piezoelectric phenomenon of the piezoelectric element 1.

Figure 2D:
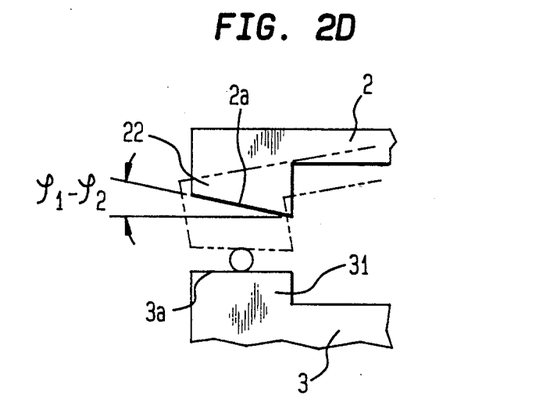

FIG. 2d is an enlargement of the ends 22 and 31 of the movable arm 2 and fixed arm 3. The initial angle of the clamping surface 2a of the movable arm 2 with respect to the clamping surface 3a of the fixed arm 3 is the angle $\mathcal{Y}_1 - \mathcal{Y}_2$. By setting the angle in this manner, when the movable arm 2 bends and clamps the wire 4 with the fixed arm 3, the clamping surface 2a of the movable arm 2 becomes parallel with the clamping surface 3a of the fixed arm 3 and the wire 4 is securely clamped. Where L is the length in the longitudinal direction of the arms 2 and 3 of the areas of the clamping surfaces 2a and 3a which clamp the wire 4, in order to securely clamp a wire 4 of diameter $d_1$, the tangent of the angle of inclination between the clamping surfaces 2a and 3a must be less than $d_1/L$. If not, the clamping surfaces 2a and 3a will come in contact and the wire 4 will not be able to be clamped. In the present invention, the clamping surface 2a of the movable arm 2 is inclined with respect to the clamping surface 3a when in a non-clamping state so the wire 4 can be clamped securely if its diameter ranges between 13 and 30 μm.

Figure 3:
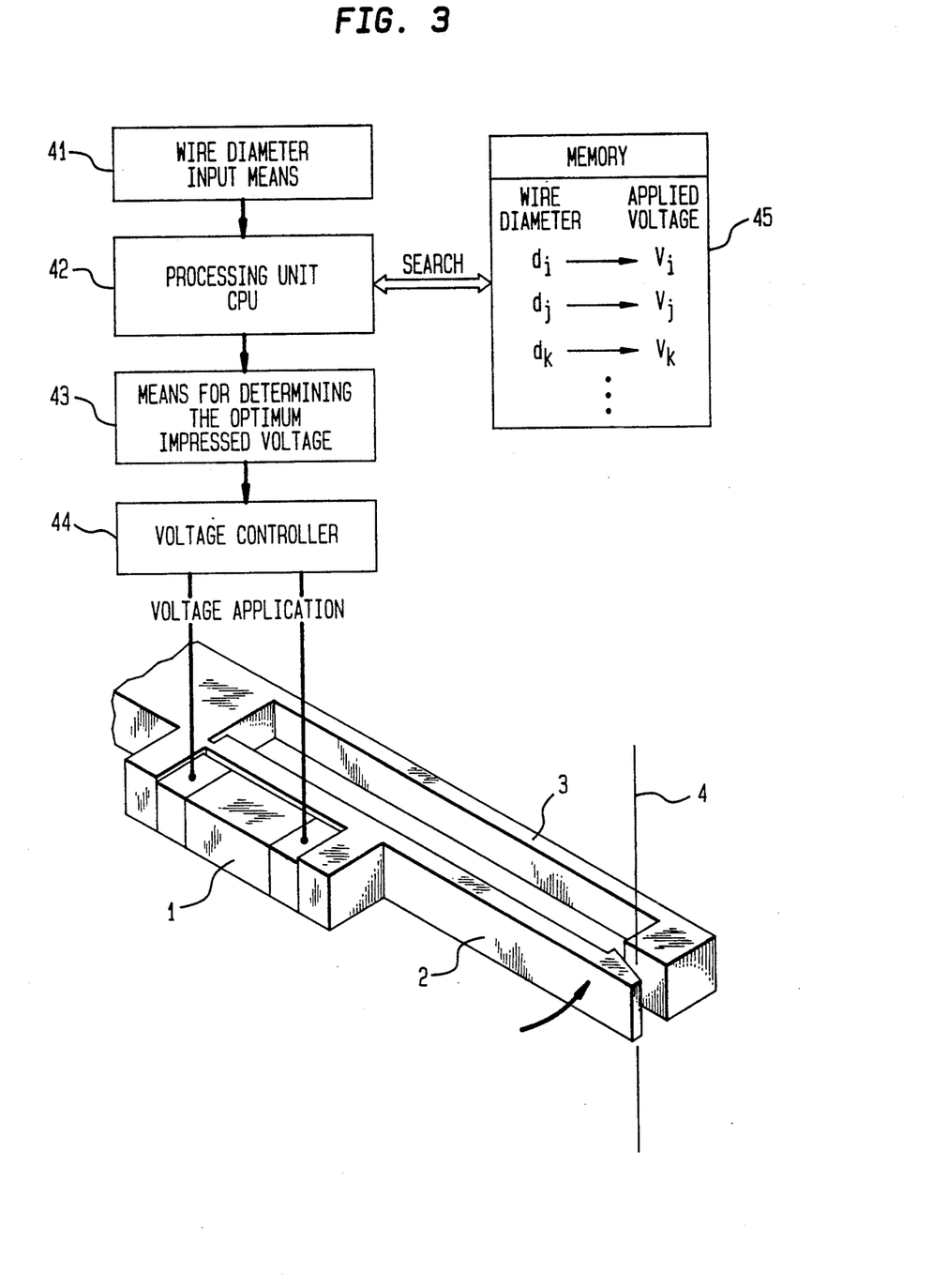
FIG. 3 shows a perspective view of the wire clamping device of the present invention together with a block diagram of the control operation.

FIG. 3 shows a clamping device wherein the voltage impressed on the piezoelectric element 1 is adjusted based on the diameter of the wire 4. The amount of deformation by said piezoelectric element 1 itself is changed by changing the voltage impressed on the piezoelectric element 1, and this changes the force $F_1$ applied to the interaction member 23 of the movable arm 2. As a result, the amount of bend in the end of the movable arm 2 changes, which changes the clamping force on the wire 4. Therefore, since the clamping force on the wire 4 is changed by changing the voltage impressed on the piezoelectric element 1, the voltage impressed on the piezoelectric element 1 is controlled to obtain the clamping force required to clamp a wire 4 of a prescribed diameter.

The relationship between the clamping force required to clamp a wire 4 of a prescribed diameter and the voltage impressed on the piezoelectric element 1 is sought beforehand based on the deformation of the piezoelectric element 1 which provides the force $F_1$ required to generate the clamping force in the movable arm 2, and the voltages impressed on the piezoelectric element 1 required to obtain the necessary clamping force for the wire 4 are set in the memory 45 as a table. The table set in this memory is searched by the processing unit (CPU) 42. The set diameter of the wire to be clamped is input to the CPU 42 via the wire diameter input means 41. Based on the wire diameter input to the CPU 42, the table of wire diameters and impressed voltages previously stored in the memory 45 is searched, and the optimum impressed voltage is determined by the means 43 for determining the optimum impressed voltage. Said means 43 for determining the optimum impressed voltage controls the voltage controller 44 so that the determined optimum impressed voltage is impressed on the piezoelectric element 1. By this means, the optimum voltage for providing the optimum clamping force on the wire of the prescribed diameter is impressed on the piezoelectric element.

As can be seen, the number of parts comprising the clamping device of the present invention are greatly reduced, so maintenance is made easier. The physical changes in the piezoelectric element in response to the voltage applied to it occur rapidly, thus giving it an excellent response characteristic, so wire can be clamped with good response. The weight of the device itself is reduced since the movable arm acts as a plate spring, and because of its excellent repeatability, consistent wire clamping can be obtained. The clamping surface of the movable arm becomes nearly parallel with the clamping surface of the fixed arm during clamping, so the wire is securely clamped.

In the clamping method of the present invention, the clamping force on the wire is changed based on the voltage impressed on the piezoelectric element, so the clamping force can be easily adjusted and a clamping force suitable to the wire diameter can be easily obtained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A wire clamping device for clamping bonding wire during wire bonding of electronic components, said wire clamping device comprising:

a fixed arm with a flat end, wherein said flat end of said fixed arm is a clamping surface;

a bendable movable arm with a flat end, wherein said flat end of said movable arm is a further clamping surface, the movable arm positionable prior to wire bonding so that a) the flat end of said fixed arm faces the flat end of said movable arm, b) a suitable gap is created so at least one of said fixed arm and said bendable movable arm is not in contact with said bonding wire, said moveable arm functioning as a plate spring and bendable so that said end of said movable arm approaches said end of said fixed arm and the clamping surfaces of said fixed arm and said movable arm are parallel and sufficiently close to each other when said movable arm is bent to clamp wire therebetween during wire bonding; and a piezoelectric element that is attached to said movable arm which bends said movable arm by mechanical deformation of said piezoelectric element in order to clamp wire between said end of said movable arm and said end of said fixed arm, wherein the flat end of the movable arm is an initial state is inclined with respect to the flat end of the fixed arm at angles of $\theta_1 - \theta_2$ indicated by the following equation, $$\mathcal{Y}_1 - \mathcal{Y}_2 = \int_0^{l_1} \frac{M_1}{E \cdot I_{z1}} dx - \int_{l_1}^{l_0} \frac{M_2}{E \cdot I_{z2}} dx \qquad (8)$$

where Young's modulus is denoted as E, a geometrical moment of interia of the movable as $I_{z1}$, a geometrical moment of interia of the fixed arm as $I_{z2}$, a bending moment generated by a force applied by the piezoelectric element of the movable arm as $M_1$, a bending moment generated by a force applied by the piezoelectric element of the fixed arm, a distance from a point of support of the movable arm to a point where the wire is clamped as $l_0$, and a distance from a point of support of the movable arm to a point which receives a bending force of the piezoelectric element $l_1$.

2. A method for clamping bonding wire during wire bonding using a movable arm and a fixed arm, said method comprising bending said movable arm from an initial position at which at least one of said movable arm and said fixed arm is not in contact with said bonding wire toward said fixed arm in order to clamp bonding wire therebetween during wire bonding of electronic components by means of mechanical deformation of a piezoelectric element, said deformation being generated by applying a voltage to said piezoelectric element.

3. A wire clamping method according to claim 2, wherein the amount of bend of said movable arm varies according to the amount of mechanical deformation of said piezoelectric element and the amount of mechanical deformation generated in said piezoelectric element varies according to the voltage applied to said piezoelectric element.

4. A wire clamping method according to claim 2, wherein the voltage to be applied to said piezoelectric element is sought beforehand based on the amount of deformation of said piezoelectric element that is required to obtain the clamping force necessary to clamp a wire of a prescribed diameter and the voltage to be applied to said piezoelectric element during wire clamping is set from said voltages obtained beforehand based on the diameter of said wire to be clamped.

* * * * *

UNITED STATES PATENT AND TRADEMARK OFFICE
CERTIFICATE OF CORRECTION

PATENT NO.  : 5,314,175
DATED       : May 24, 1994
INVENTOR(S) : Izumi et al.

It is certified that error appears in the above-identified patent and that said Letters Patent is hereby corrected as shown below:

On the cover page, [73] the word "Kadoma" should be --Osaka--.

On the cover page, [56] the reference Shibuya "3,855,633" should be --4,855,633--.

On the cover page [57] line 4, the word "and" should be --end--.

In column 3, line 58, after the word "by" delete ",".

In column 4, line 23-24, after the word distance "f rom" should be --from--.

In column 4, line 26, the word "banding" should be --bending--.

In column 4, line 53-54, the word "banding" should be --bending--.

In column 7, line 4, "is" should be --in--.

UNITED STATES PATENT AND TRADEMARK OFFICE
CERTIFICATE OF CORRECTION

PATENT NO.  : 5,314,175
DATED       : May 24, 1994
INVENTOR(S) : Izumi et al.

It is certified that error appears in the above-identified patent and that said Letters Patent is hereby corrected as shown below:

In column 7, line 6, "$\theta_1 - \theta_2$" should be changed to --$\mathcal{J}_1 - \mathcal{J}_2$--.

In column 7, line 14, "interia" should be changed to --inertia--.

In column 7, line 15, "interia" should be changed to --inertia--.

Signed and Sealed this

Twentieth Day of December, 1994

Attest:

BRUCE LEHMAN

Attesting Officer     Commissioner of Patents and Trademarks